US006343163B1

(12) United States Patent
Kawanishi

(10) Patent No.: US 6,343,163 B1
(45) Date of Patent: Jan. 29, 2002

(54) ELECTRO-ABSORPTION MODULATOR AND METHOD OF MANUFACTURING A SEMICONDUCTOR OPTICAL DEVICE

(75) Inventor: Hidekazu Kawanishi, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/527,393

(22) Filed: Mar. 16, 2000

(30) Foreign Application Priority Data

Nov. 17, 1999 (JP) .......................................... 11-326685

(51) Int. Cl.⁷ .............................................. G02F 1/035
(52) U.S. Cl. ............................... 385/2; 385/14; 385/40; 385/41
(58) Field of Search ................................ 385/1–10, 14, 385/40, 41

(56) References Cited

U.S. PATENT DOCUMENTS

| 5,522,005 A | * | 5/1996 | Moretti et al. ............... 385/129 |
| 5,717,710 A | * | 2/1998 | Miyazaki et al. .............. 372/50 |
| 5,754,714 A | * | 5/1998 | Suzuki et al. ................. 385/5 |
| 5,764,820 A | * | 6/1998 | De Dobbelaere et al. ..... 385/14 |
| 5,907,646 A | * | 5/1999 | Kitamura ..................... 385/14 |

OTHER PUBLICATIONS

"Reliability Study of InGaAlAs/In/AlAs MQW Electro–absorption Modulators", Technical Digest of Third Optoelectronics and Communication Conference, Jul. 1998, Makuhari Messe, pp. 452–453.

"76–km transmisssion over standard dispersion fiber at 10 Gbit/s using a high power integrated laser modulator and a PIN receiver without any optical amplifer" OFC Technical Digest, Wednesday Afternoon, pp. 199–200, Feb. 1997.

* cited by examiner

Primary Examiner—Akm E. Ullah
Assistant Examiner—Jennifer Doan
(74) Attorney, Agent, or Firm—Volentine Francos, PLLC

(57) ABSTRACT

An electro-absorption modulator is rendered capable of withstanding increased optical input power by one of the following means: incorporating a heat sink into the electro-absorption modulator structure to conduct heat away from the optical waveguide; incorporating a resistive member into the upper electrode of the electro-absorption modulator, producing a voltage drop that reduces absorption near the optical input end of the waveguide; making the bandgap energy of the absorbing layer of the waveguide higher at the optical input end than at the optical output end; and placing the electrode pad of the upper electrode near the optical input end.

26 Claims, 11 Drawing Sheets

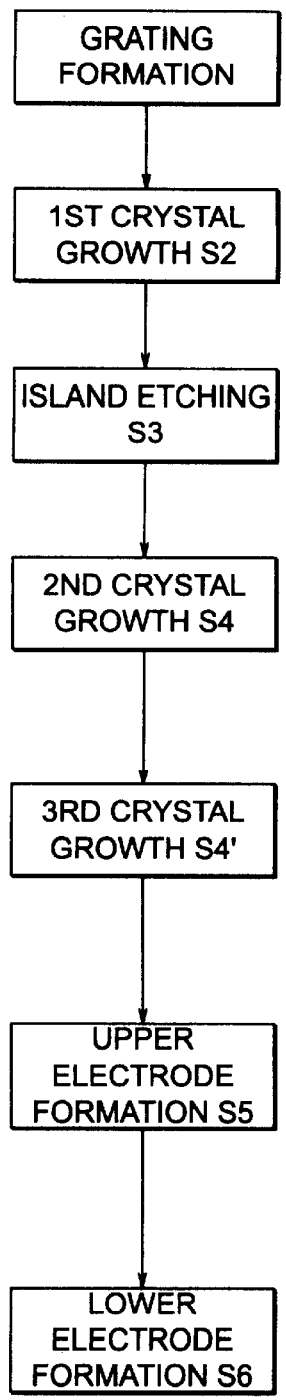
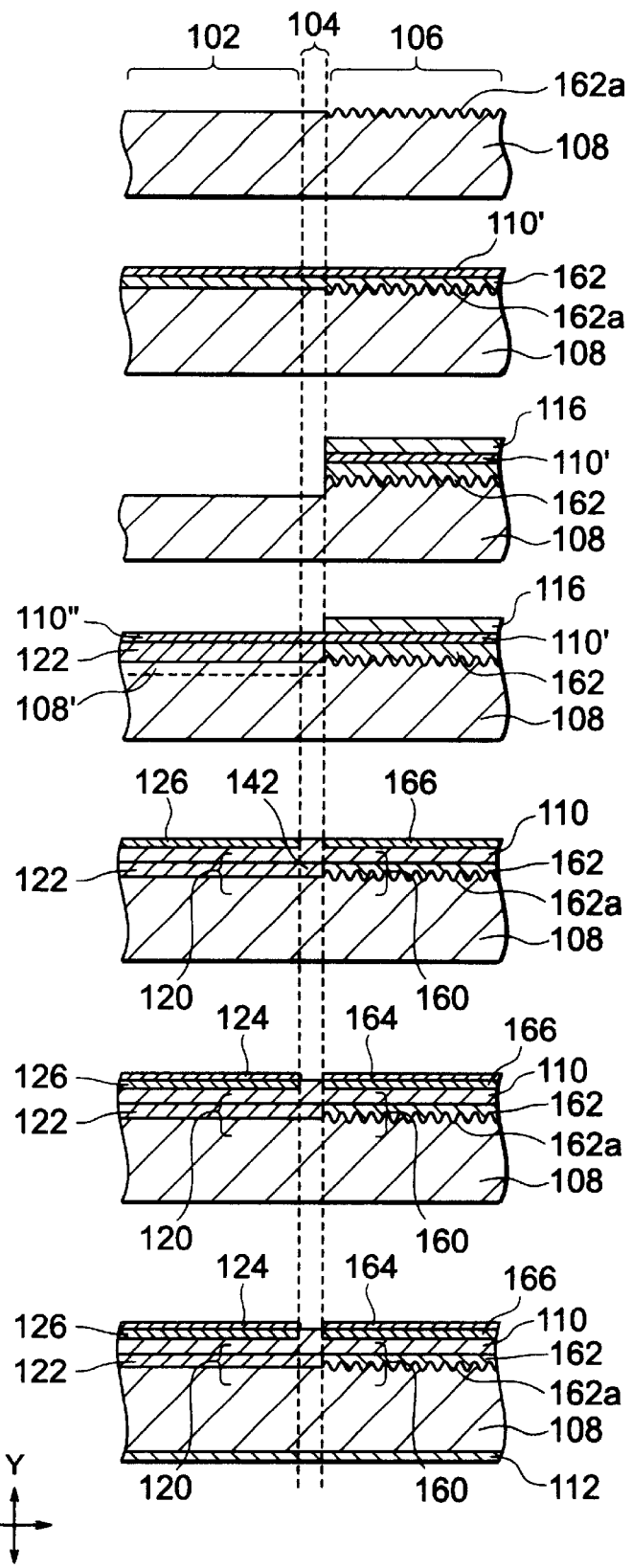

ELECTRO-ABSORPTION MODULATOR AND METHOD OF MANUFACTURING A SEMICONDUCTOR OPTICAL DEVICE

BACKGROUND OF THE INVENTION

This application is a counterpart of Japanese Patent Application Ser. No. 326685/1999, filed Nov. 17, 1999, the subject matter of which is incorporated herein by reference.

The present invention relates to an electro-absorption modulator, and to a method of manufacturing an optical device from semiconductor materials.

An electro-absorption modulator is an opto-electronic device that modulates light intensity by modulating an electric field controlling absorption of the light. Electro-absorption modulators are used for various types of optical signal processing. In particular, the output of a semiconductor laser diode can be modulated more rapidly by an electro-absorption modulator than by modulation of the driving power of the laser diode itself. Electro-absorption modulators can be fabricated from semiconductor materials, enabling a modulator and laser to be integrated into the same semiconductor chip. Integrated laser-modulator chips with a distributed-feedback (DFB) laser are useful as transmitters in high-bandwidth fiber-optic communication systems.

Since the absorption of light generates heat, electro-absorption modulators are vulnerable to thermal damage. The optical input power level at which thermal damage occurs is referred to as the damage level. Thermal damage is discussed in "Reliability Study of InGaAlAs/InAlAs MQW Electro-absorption Modulator," a paper presented by H. Kamioka et al. at the Optoelectronics and Communications Conference (OECC) held at Makuhari Messe in Japan in July 1998, published in the OECC Technical Digest (pp. 452–453). This paper studies damage levels of different electro-absorption modulator structures and their reliability below the damage level, concluding that damage level and reliability are related to the ability of the structure to dissipate the heat generated by absorption. The high mesa structure, for example, is found to dissipate heat more effectively than the buried heterostructure and thus to have a higher damage level.

The buried heterostructure, using semi-insulating iron-doped indium phosphide (Fe-doped InP), has been employed in integrated laser-modulator chips designed for broadband communication applications, but in addition to its low damage level, this structure is comparatively difficult to fabricate, because of the difficulty of growing crystalline semi-insulating InP with sufficiently high electrical resistance. An alternative structure is the ridge waveguide structure described in "76-km transmission over standard dispersion fiber at 10 Gbit/s using a high-power integrated laser modulator and a PIN receiver without any optical amplifier" by D. Lesterlin et al. in a paper presented at the Wednesday afternoon poster session of the 1997 Optical Fiber Communication (OFC) conference, published in the OFC Technical Digest, pp. 199–200.

With the ridge waveguide structure, it is comparatively easy to achieve a broadband electro-absorption modulator, and the device can be fabricated with fewer crystal growth steps than are needed for a buried-heterostructure waveguide. The ridge structure is intermediate between the buried heterostructure and the high mesa structure, however, so its thermal damage level can be expected to be intermediate between the damage levels found in those two structures.

There is a general need to enable electro-absorption modulators to withstand higher levels of optical power, so that signals can be transmitted over greater distances in optical communication systems. In particular, electro-absorption modulators with a ridge waveguide structure need to have higher damage levels if the full benefits of the ridge structure are to be realized.

SUMMARY OF THE INVENTION

One object of the present invention is to provide electro-absorption modulators with higher damage levels.

The invented electro-absorption modulator has an optical waveguide with an optical input end and an optical output end. A first electrode is disposed above the optical waveguide. A second electrode is disposed below the optical waveguide. An electric field applied to the optical waveguide from the first and second electrodes modulates the absorption of light in the optical waveguide as the light travels from the input end to the output end.

According to one aspect of the invention, the electro-absorption modulator also has a heat sink running parallel to the optical waveguide on one or both sides. The heat sink cools the optical waveguide by conducting heat away, thereby preventing overheating of the optical waveguide as a whole. By conducting heat in the lengthwise direction of the optical waveguide, the heat sink also prevents localized hot spots from forming. These features improve the ability of the electro-absorption modulator to withstand high optical input levels.

The heat sink is preferably formed as a thin metal film, metals in general being good conductors of heat. The optical waveguide may have an inverted mesa structure, in which case the overhanging part of the optical waveguide can function as a spacer when the heat sink is formed.

According to another aspect of the invention, the electro-absorption modulator is structured so as to reduce optical absorption near the optical input end of the optical waveguide, where most of the optical absorption and heating occur in a conventional electro-absorption modulator. This reduction also improves the ability of the modulator to withstand high optical input levels.

One way to obtain the desired absorption reduction is to reduce the electric field applied to the optical input end of the waveguide. The first electrode typically includes a stripe running parallel to the optical waveguide, and a pad connected to an external power source. In this configuration, the electric field can be reduced by an electrical resistance that produces a voltage drop between the electrode pad and the end of the electrode stripe disposed above the optical input end of the waveguide.

For example, the stripe can be divided into two or more segments, which are coupled in series through interconnecting members offering a higher electrical resistance than the stripe itself. A voltage drop equal to the product of the higher resistance and the current flowing through the resistance is produced. The resistive interconnection is preferably offset to one side of the stripe, away from the optical waveguide, thereby protecting the optical waveguide from joule heating that occurs in the interconnection resistance. The offset distance can be selected to obtain the necessary degree of protection, provided the voltage drop remains within an acceptable limit. The interconnection may include a section having an electrical conductance that can be adjusted to obtain a desired voltage drop. In particular, the interconnection may include a thin-film resistor, which can be formed easily by standard semiconductor fabrication techniques such as vacuum evaporation, lift-off, and photolithography. The thin film may have a different composition from the stripe itself; the thin-film material or materials can be selected to obtain a desired electrical resistance.

Alternatively, light absorption can be reduced at the optical input end of the waveguide by providing the absorbing layer of the waveguide with a higher bandgap energy at the optical input end than at the optical output end. For example, the optical waveguide can be fabricated by selective crystal growth.

In another aspect of the invention, the pad of the first electrode is disposed near the optical input end of the optical waveguide, to reduce the amount of heat generated by current flow in the stripe of the first electrode, particularly near the optical input end of the waveguide. Thermal damage to the electro-absorption modulator is thereby prevented, in that the temperature of the optical input end of the optical waveguide is lowered. This configuration is conditional on the modulation frequency, in that the pad must be located so that the high-frequency component of the applied voltage propagates through the entire stripe, but this condition does not appear to present problems at the modulation frequencies used in communication systems at present.

In all of the above aspects of the invention, the optical waveguide is preferably a ridge waveguide. A ridge waveguide is easier to fabricate than a buried-heterostructure waveguide, and is better than a high-mesa waveguide at providing the conditions for single-mode wave propagation. An electro-absorption modulator with a ridge waveguide can also be adapted comparatively easily for broadband operation.

The invented electro-absorption modulator can be integrated with a semiconductor laser into a monolithic device.

The invention also provides a general method of fabricating a semiconductor optical device. The invented method includes the formation of an optical waveguide having an inverted-mesa channel, and the formation of a heat sink by use of the inverted-mesa channel as a spacer, so that the heat sink extends parallel to the optical waveguide. The heat sink is thereby formed without the need for a separate masking pattern, and is positioned to cool the optical waveguide by conducting heat away from the optical waveguide, without being so close to the waveguide as to interfere with wave propagation in the waveguide. The spacing between the optical waveguide and the heat sink can be adjusted by adjustment of the height of the channel.

The semiconductor optical device may have an upper cladding layer that is partly doped with an impurity element to form a contact layer. In this case, the heat sink and a thin impurity-source film can be formed in the same step, simplifying the fabrication process.

BRIEF DESCRIPTION OF THE DRAWINGS

In the attached drawings:

FIG. 4A is a flowchart of a manufacturing process for the device in FIG. 1;

FIG. 4B is a series of sectional views showing the device at corresponding stages of the manufacturing process in FIG. 4A;

DETAILED DESCRIPTION OF THE INVENTION

Figure 1:
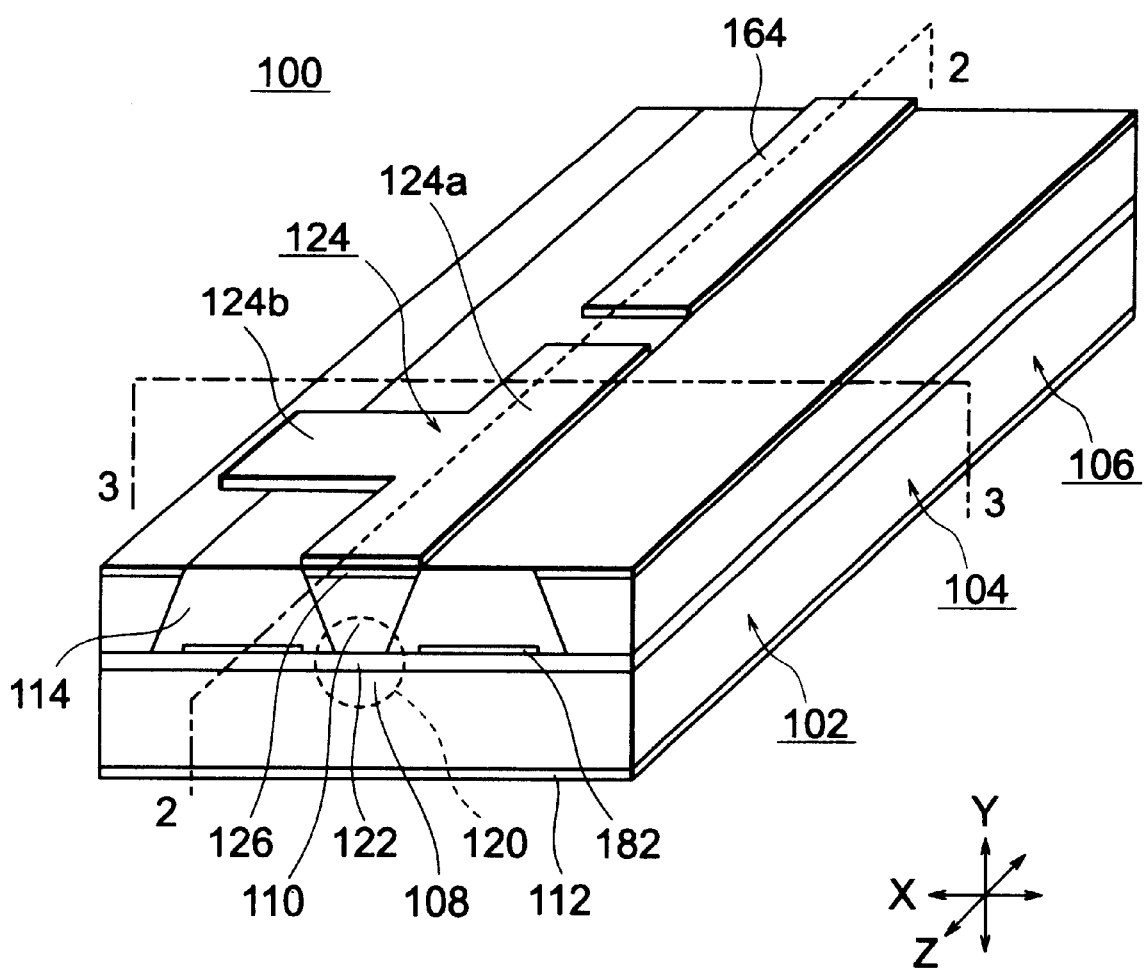
FIG. 1 is a perspective view of a monolithic laser-modulator device including an electro-absorption modulator illustrating a first embodiment of the invention.

Preferred embodiments of the invention will now be described in detail with reference to the attached drawings, in which similar elements are indicated by three-digit reference numerals having the same last two digits, the first digit being used to distinguish occurrences of these elements in different embodiments. Redundant descriptions of identical elements will be omitted.

FIG. 1 shows a monolithic integrated laser-modulator device 100 including an electro-absorption modulator zone 102, an isolation zone 104, and a DFB laser zone 106. The electro-absorption modulator zone 102 and the DFB laser zone 106 will also be referred to simply as the electro-absorption modulator and DFB laser, respectively. The electro-absorption modulator 102 embodies the present invention.

The device 100 has a substrate 108 that also serves as a lower cladding layer. A partly etched upper cladding layer 110 is disposed above the substrate 108 in all three zones 102, 104, 106. A lower electrode 112 is disposed below the substrate 108. The etched portions of the upper cladding layer 110 are filled in with filler layers 114. A thin metal film 182 is disposed at the bottom of each filler layer 114, extending at least for the entire length of the electro-absorption modulator zone 102. The thin metal film 182 may also extend through the DFB laser zone 106.

An optical waveguide of the ridge type, having an inverted mesa structure, extends lengthwise through the center of the device, parallel to the Z-axis indicated in the drawing. The central upper cladding layer 110 provides the channel of the waveguide. In the electro-absorption modulator zone 102, the optical waveguide 120 is centered in an absorbing layer 122 disposed between the substrate 108 and upper cladding layer 110. The absorbing layer 122 has a bulk crystalline structure, which is more easily fabricated than the multiple-quantum-well (MQW) structure used in many conventional electro-absorption modulators.

An upper electrode 124 is formed on the upper surface of the electro-absorption modulator zone 102. The upper electrode 124 includes an electrode stripe 124a extending parallel to the optical waveguide 120, and an electrode pad 124b connected to the electrode stripe 124a and to an external power source (not visible). The electrode pad 124b extends sideways away from the electrode stripe 124a, so that a bonding wire (not visible) can be attached to the electrode pad 124b without stressing the optical waveguide 120. A contact layer 126, disposed below the upper electrode 124, provides an ohmic contact between the upper electrode 124 and the upper surface of the upper cladding layer 110. A separate upper electrode 164 is formed on the upper surface of the DFB laser zone 106.

Figure 2:
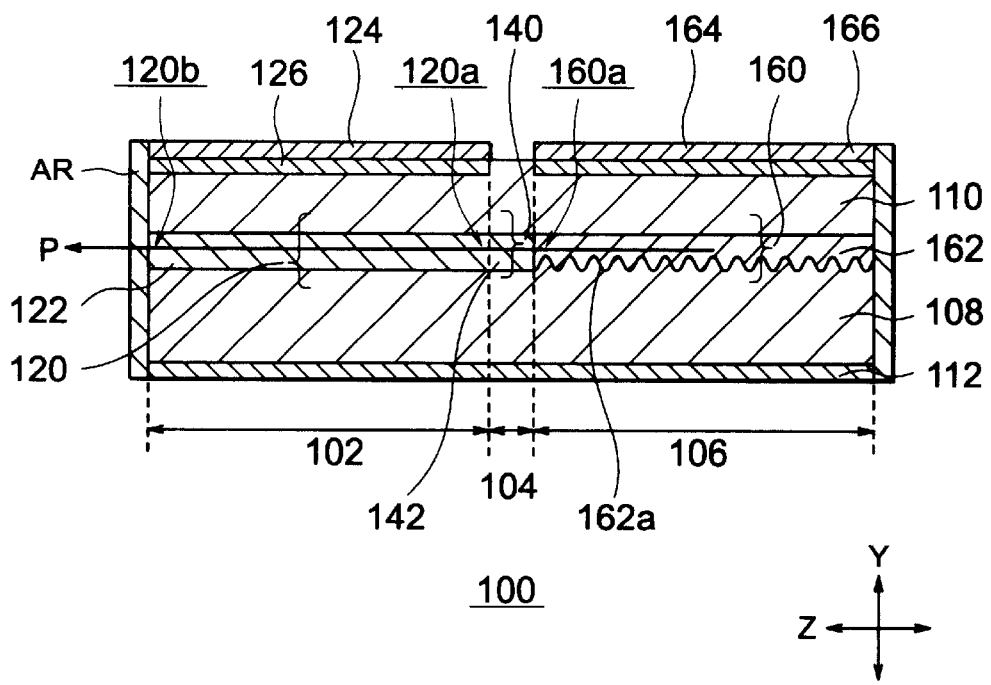
FIG. 2 is a sectional view through line 2—2 in FIG. 1.

FIG. 2 shows a longitudinal or Z-axis cross section through the center of the device 100. The DFB laser 106 also has a contact layer 166, disposed below the upper electrode 164, providing an ohmic contact between the upper electrode 164 and the upper surface of the upper cladding layer 110. No contact layer is present in the isolation zone 104, which provides electrical isolation between the upper electrode 124 of the electro-absorption modulator 102 and the upper electrode 164 of the DFB laser 106.

In the isolation zone 104, the optical waveguide 140 includes a core layer 142. In the DFB laser zone 106, the optical waveguide 160 includes an active layer 162. The absorbing layer 122, core layer 142, and active layer 162 are mutually aligned. The active layer 162 is a semiconductor layer configured as a multiple quantum well. The multiple-quantum-well structure enables electrical and optical properties differing from those of the bulk semiconductor material to be created artificially, to enhance the lasing performance of the DFB laser 106. The active layer 162 has a separate-confinement heterostructure (SCH), meaning that light is confined to waveguide layers disposed above and below a carrier confinement layer, by differing refractive indices of the layers. A grating 162a is formed in the lower surface of the active layer 162 to provide distributed feedback during lasing operation.

Light P generated in the DFB laser 106 leaves the optical output end 160a of the optical waveguide 160 in the DFB laser 106, travels through the optical waveguide 140 in the isolation zone 104, enters the optical waveguide 120 in the electro-absorption modulator 102 at its optical input end 120a, and leaves the optical waveguide 120 at its optical output end 120b. The front facet of the device has an anti-reflection (AR) coating to prevent reflection of light emerging from the optical output end 120b.

Figure 3:
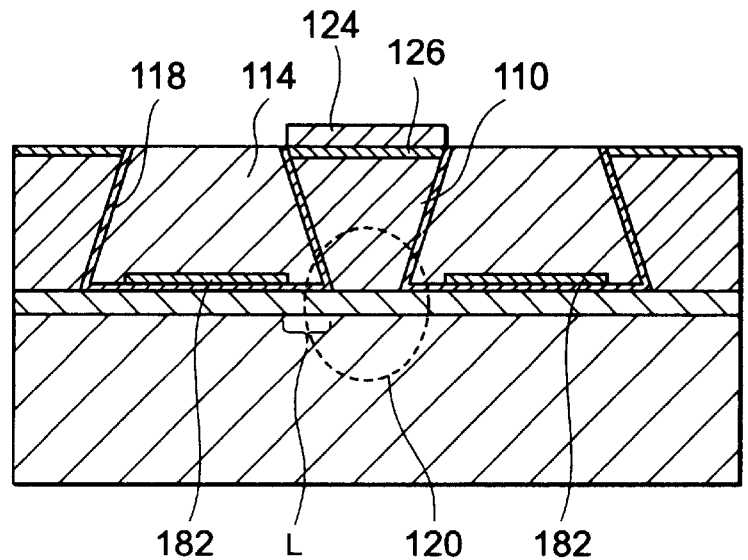
FIG. 3 is a sectional view through line 3—3 in FIG. 1.

FIG. 3 shows a lateral or X-axis cross section through the electro-absorption modulator 102. The inner surfaces of the filler layers 114 are coated with a dielectric film 118. The thin metal film 182 overlies this dielectric film 118, separated from the base of the upper cladding layer 110 by a distance L corresponding to the overhang of the inverted mesa. The distance L should be sufficient to assure that the thin metal film 182 has substantially no effect on light propagation in the optical waveguide 120. For single-mode devices, L should be adequate to position the thin metal film 182 where the single-mode propagation intensity is low enough to render the effect of the thin metal film 182 negligible. The thin metal film 182 functions as a heat sink for the optical waveguide 120, cooling the optical waveguide 120 by conducting heat away from it.

Next, a process for manufacturing the above optoelectronic device 100 will be described.

Referring to FIG. 4A, the manufacturing process has six main steps: a grating formation step S1; a first crystal growth step S2; an island etching step S3; a second crystal growth step S4, followed by a third crystal growth step S4'; an upper electrode formation step S5; and a lower electrode formation step S6. Several of these steps comprise two or more sub-steps, as will be described. These steps are carried out on a wafer in which many devices 100 are formed simultaneously. The manufacturing process also includes a few well-known steps, such as a wafer cleavage step, an anti-reflection coating step, and a carrier mounting step or wire bonding step, which will not be described.

The grating formation step S forms the grating 162a on the surface of the substrate 108 in the DFB laser zone 106.

The first crystal growth step S2 forms the active layer 162 and a growth-base film 110', forming these layers on the entire surface of the substrate 108, by metal-organic vapor-phase epitaxial growth (MOVPE), for example. The active layer 162 is formed as a multiple-quantum-well layer with the separate-confinement heterostructure noted above. The growth-base film 110' comprises the same material as the upper cladding layer 110, providing a base on which the upper cladding layer 110 can be grown easily in the second crystal growth step, described below.

Figure 5A:
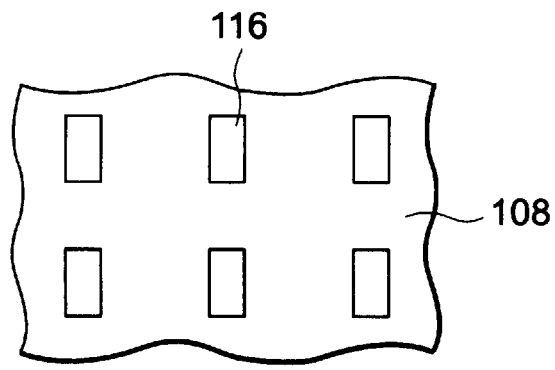
FIGS. 5A, 5B, 5C, and 5D are plan views illustrating various stages of the manufacturing process in FIG. 4A.

The island etching step S3 is a selective etching step that etches the electro-absorption modulator zone 102 and isolation zone 104 down to the substrate 108, leaving the active layer 162 and growth-base film 110' present only in the DFB laser zone 106. A slight amount of the substrate 108 is removed in the electro-absorption modulator zone 102 and isolation zone 104. The etching is preceded by the formation of a mask layer 116 of, for example, silicon dioxide ($SiO_2$), covering the DFB laser zone 106 and exposing the electro-absorption modulator zone 102 and isolation zone 104. FIG. 5A illustrates the surface of the wafer after the island-etching step S3.

The second crystal growth step S4 forms the absorbing layer 122, the core layer 142, and another growth-base film 110". First, an adjustment film 108', comprising the same material as the substrate 108, is grown on the exposed surfaces of the electro-absorption modulator 102 and isolation zone 104, by MOVPE, for example, to planarize the surface of the substrate 108. The planarized surface of the substrate 108 is substantially level with the lower surface of the active layer 162. Next, the absorbing layer 122 and core layer 142 are grown on the planarized surface of the substrate 108, by MOVPE, for example. The second growth-base film 110" is then grown on the surfaces of the absorbing layer 122 and core layer 142.

Figure 5B:
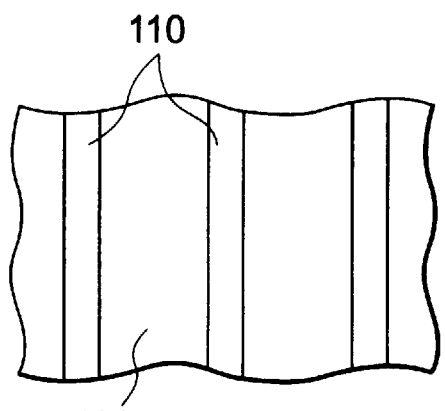

The third crystal growth step S4' forms the upper cladding layer 110, the contact layers 126, 166, and various other features. After the mask layer 116 is removed, the upper cladding layer 110 is initially formed, by MOVPE, for example, as a layer covering the entire wafer surface. Part of this layer is then removed, by an anisotropic etching process, for example, to form the inverted mesa structure. As illustrated in FIG. 5B, cladding material is removed in parallel strips down to the absorbing layer 122 and the other layers level therewith. The remaining upper cladding layer 110 has the form of a series of ridges with inverted-mesa cross sections. Next, the dielectric film 118 is formed on the entire wafer surface, excepting the upper surface of the upper cladding layer 110. The dielectric film 118 is formed as, for example, a silicon dioxide film.

Figure 6:
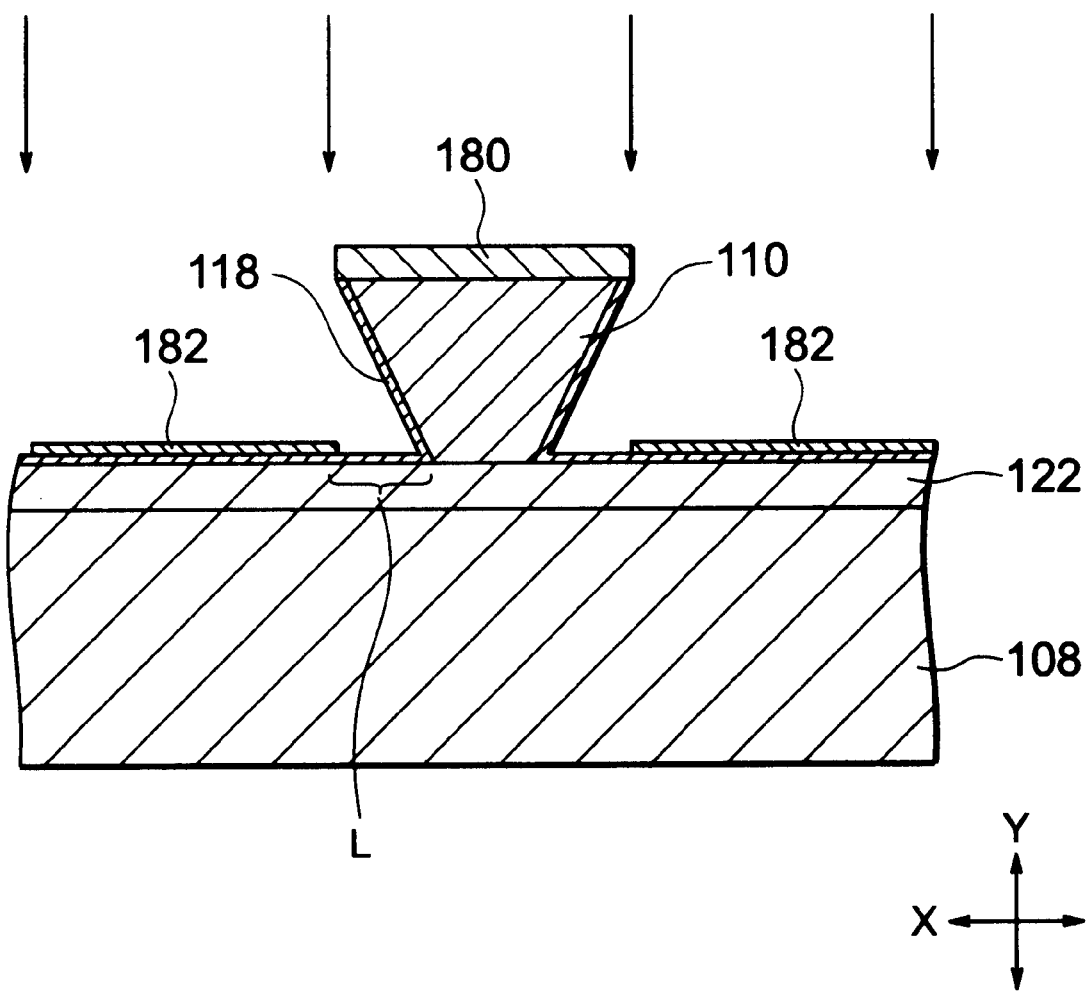
FIG. 6 is a sectional view illustrating a metalization step performed in the manufacturing process in FIG. 4A.

Referring to FIG. 6, a thin metal film is now deposited on the wafer surface, by vacuum evaporation, for example. Where the upper cladding layer 110 has been removed, the metal is deposited on the dielectric film 118, forming the metal heat-sink films 182 separated from the base of the upper cladding layer 110 by the distance L described earlier. The distance L can be adjusted by adjusting the height of the upper cladding layer 110; that is, by controlling the thickness of the upper cladding layer 110 in the third crystal growth step S3. Where the metal is deposited on the upper cladding layer 110, a thin metal film 180 is formed. This metal film 180 includes substances that will be introduced into the upper cladding layer as impurity elements to create the contact layers 126, 166. The metal films 180, 182 are, for example, gold-zinc (Au—Zn) thin films.

Figure 5C:
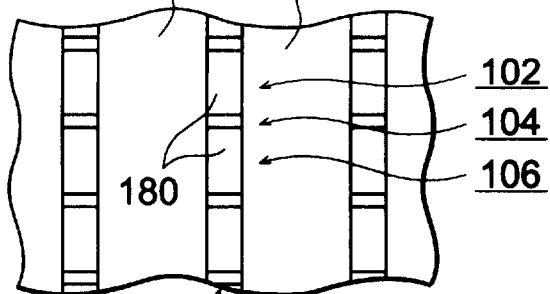
Figure 5D:
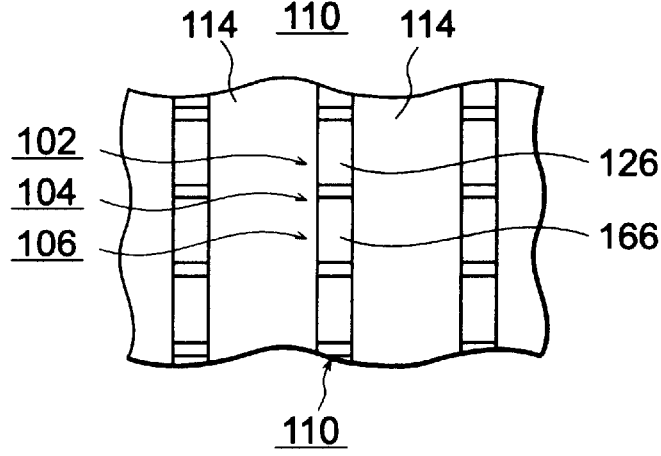

Metal film 180 is not formed on the isolation zone 104. (Alternatively, the metal film 180 is formed on, then removed from the isolation zone 104). At the end of the metalization process, the wafer has the appearance shown in FIG. 5C. The wafer is now heated, causing impurity atoms to diffuse from metal film 180 into the upper cladding layer 110, forming the contact layers 126, 166. Following this heat treatment, the filler layers 114 are formed, filling in the spaces between the inverted-mesa cladding ridges. The metal heat-sink films 182 are buried beneath the filler layers 114. At the end of this step, the wafer has the appearance shown in FIG. 5D.

In the upper electrode formation step S5, the upper electrodes 124, 164 are formed by, for example, the lift-off method. The upper electrode 124 in each electro-absorption modulator zone 102 has the configuration shown in FIG. 1, comprising an electrode stripe 124a and an electrode pad 124b.

In the lower electrode formation step S6, the lower electrode 112 is formed on the entire underside of the wafer.

Next, the operation of the first embodiment will be described.

During operation, the lower electrode 112 is coupled to ground, and a continuous current is injected from upper electrode 164 into the optical waveguide 160 in the DFB laser 106, while a modulated electric field is applied from upper electrode 124 to the optical waveguide 120 in the electro-absorption modulator 102. In optical communication applications, the applied electric field may have a very high frequency, such as a frequency of several tens of gigahertz. The light P generated by laser action in the DFB laser 106 is absorbed in the electro-absorption modulator 102, to a degree controlled by the instantaneous strength of the applied electric field. A modulated light beam is thus emitted from the optical output end 120b of the optical waveguide 120.

Light being a form of energy, the absorption of light generates heat in the optical waveguide 120, but the heat is conducted away from the optical waveguide 120 by the thin metal heat-sink film 182, which has a much higher thermal conductivity than do the constituent materials of the substrate 108, upper cladding layer 110, and filler layers 114. The metal heat-sink film 182 also distributes heat evenly along the length of the optical waveguide 120, compensating for the fact that light absorption and heating occur predominantly near the optical input end 120a of the optical waveguide 120. Thus the optical waveguide 120 is cooled both locally and globally by the thin metal film 182.

This cooling effect enables the DFB laser 106 to operate at power levels that would damage the electro-absorption modulator 102 by overheating if the optical waveguide 120 were not cooled. The cooling effect also improves the reliability of the device 100 at all power levels.

Next, a second embodiment will be described, with reference to FIGS. 7 to 9.

Figure 7:
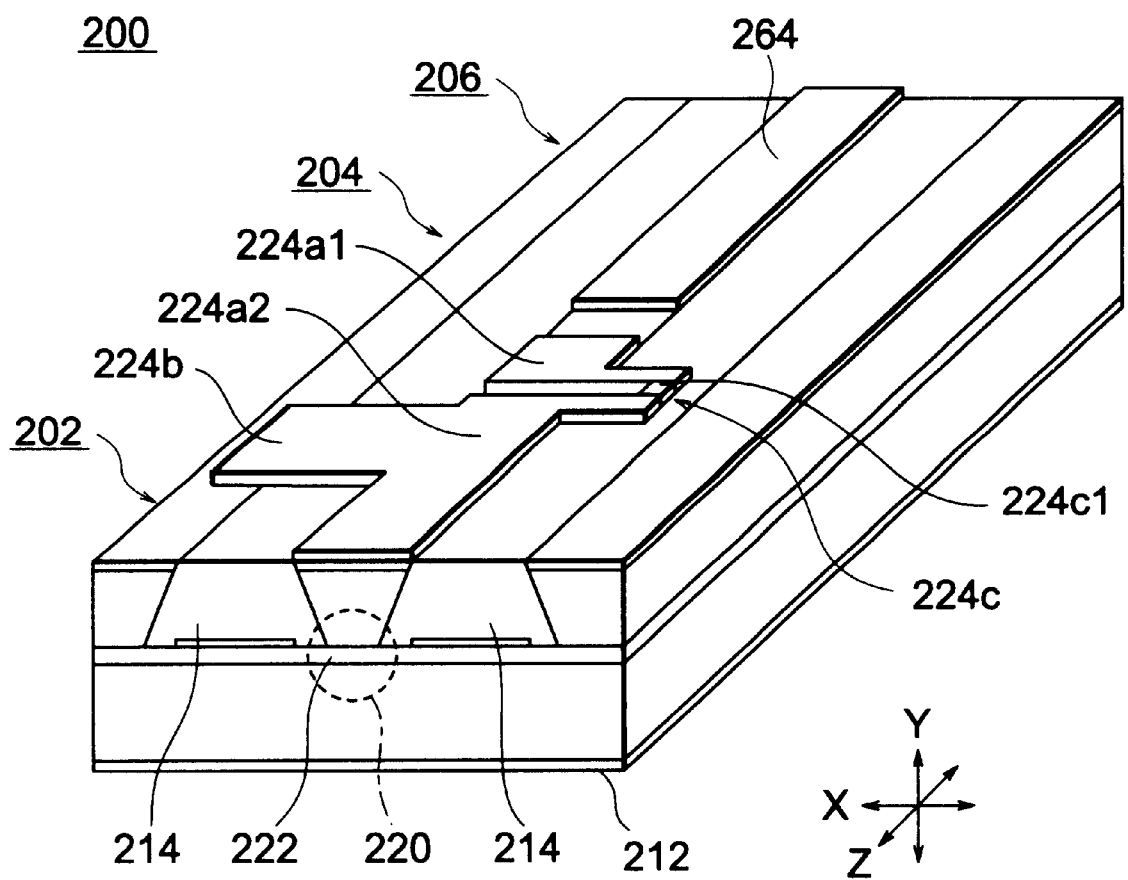
FIG. 7 is a perspective view of a monolithic laser-modulator device including an electro-absorption modulator illustrating a second embodiment of the invention.

FIG. 7 shows an integrated laser-modulator device 200 that is divided into an electro-absorption modulator zone 202, an isolation zone 204, and a DFB laser zone 206, with filler layers 214, a lower electrode 212, an optical waveguide 220, and an absorbing layer 222 that is present only in the electro-absorption modulator zone 202. Except for the upper electrode in the electro-absorption modulator zone 202, these elements are similar to the corresponding elements in the first embodiment. The isolation zone 204 and DFB laser 206 have exactly the same internal structure and functions as in the first embodiment.

The upper electrode of the electro-absorption modulator 202 differs from the upper electrode in the first embodiment in that the electrode stripe paralleling the optical waveguide 220 is divided into two parts: a first part 224a1 disposed near the isolation zone 204, and a second part 224a2 extending to the output end of the optical waveguide 220. The electrode pad 224b is connected to the second part 224a2 of the stripe, and to an external power source (not visible). The two parts 224a1, 224a2 of the stripe are interconnected by a resistive member 224c disposed on the surface of one of the filler layers 214, extending sideways from the stripe. The resistive member 224c includes a thinfilm resistor 224c1, disposed at the end of the sideways extension.

The DFB laser 206 has an upper electrode 264 similar to the upper electrode in the first embodiment.

Figure 8:
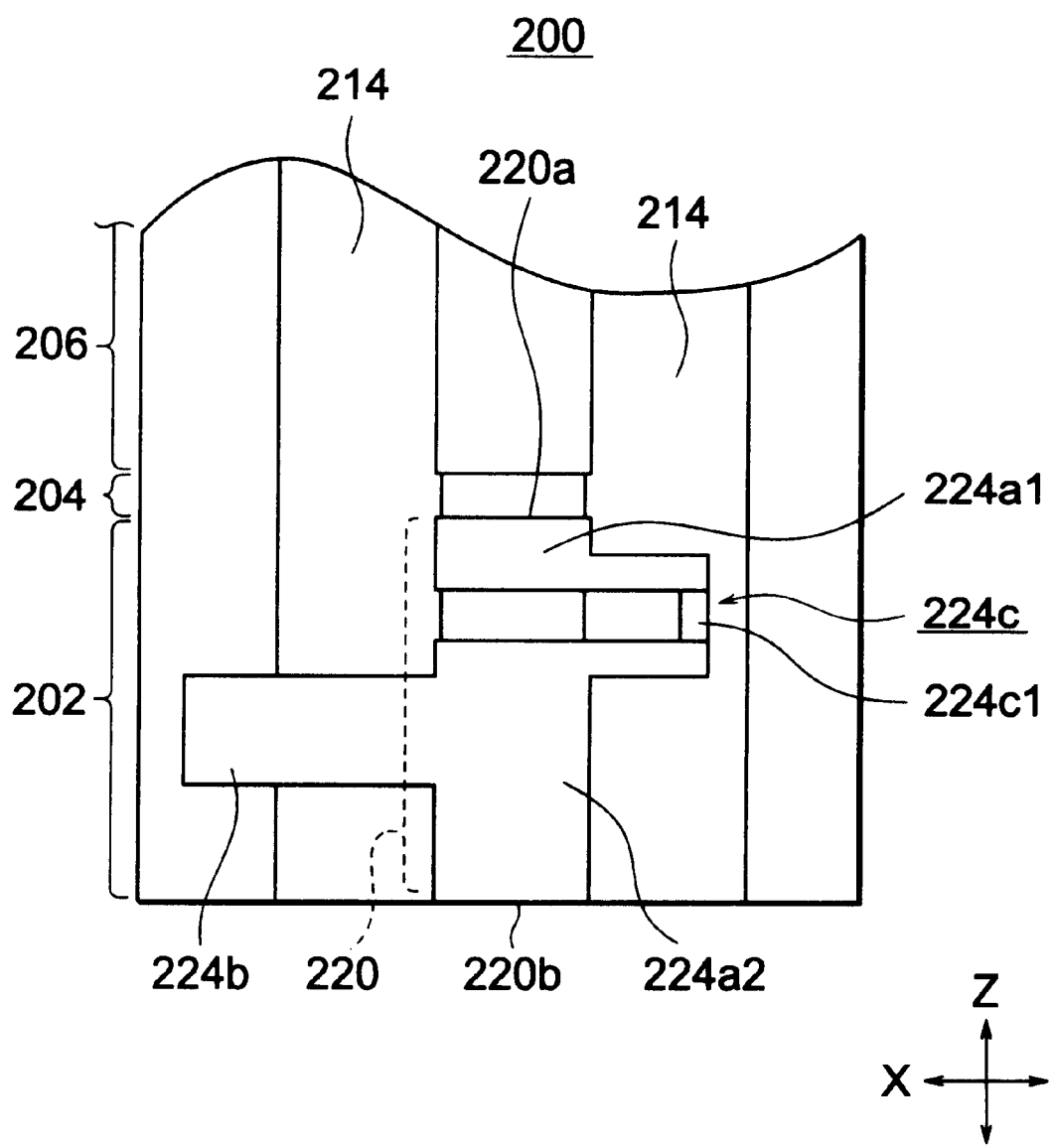
FIG. 8 is a plan view of the device in FIG. 7.
Figure 9:
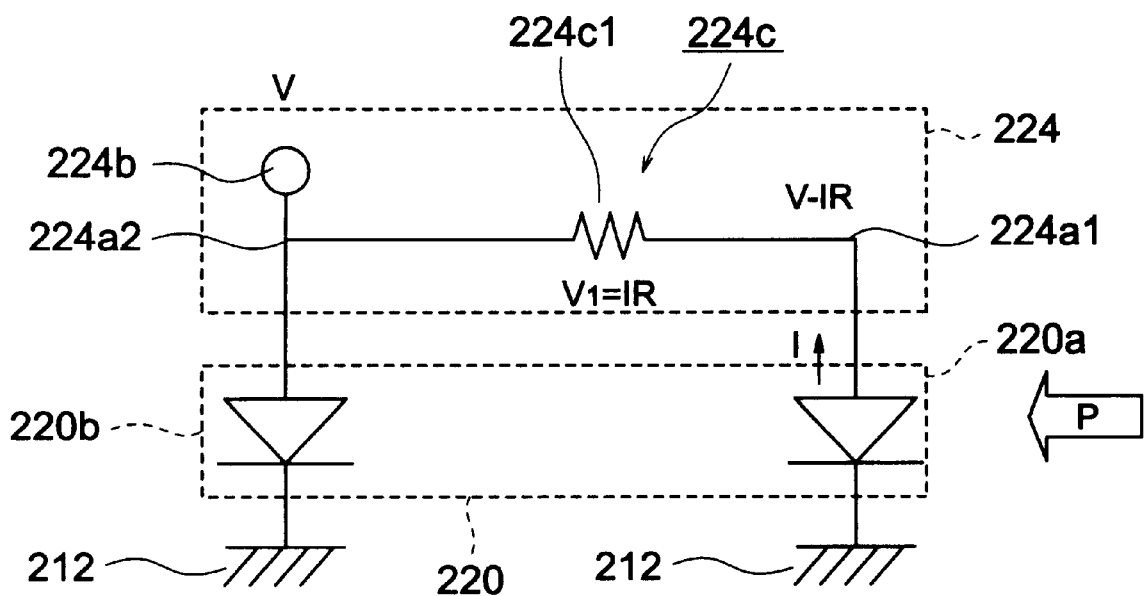
FIG. 9 is an equivalent circuit diagram of the electro-absorption modulator in FIG. 7.

Referring to FIG. 8, the first part 224a1 of the electrode stripe in the electro-absorption modulator zone 202 extends to the optical input end 220a of the optical waveguide 220. The resistive member 224c is arranged so that all current flowing between the two parts 224a1, 224a2 of the electrode strip passes through the thin-film resistor 224c1. The thin-film resistor 224c1 has a rectangular shape with the long axis of the rectangle substantially parallel to the axis of the optical waveguide 220 and the electrode stripe. The thin-film resistor 224c1 comprises a metal material having a lower electrical conductivity than the other parts of the resistive member 224c. These other parts of the resistive member 224c are formed from the same material as the electrode stripe, but are narrower in width. Consequently, the entire resistive member 224c offers greater electrical resistance per unit length than does the electrode stripe. The total electrical resistance of the resistive member 224c can easily be adjusted by adjusting its width, thickness, and total length, by adjusting the dimensions of the thin-film resistor 224c1 , and by selection of a material with suitable electrical conductivity for the thin-film resistor 224c1.

The electrode stripe 224a1 , 224a2 and pad 224b2 comprise, for example, a highly conductive metal such as gold (Au). The thin-film resistor 224c1 comprises, for example, a low-conductivity metal such as titanium (Ti) or tungsten (W).

The integrated laser-modulator 200 can be manufactured by a modification of the process illustrated in FIG. 4A. The upper electrode formation step S5 is now divided into two sub-steps, one sub-step forming the thin-film resistor 224c1, the other sub-step forming the other parts of the upper electrodes. Both sub-steps can be performed by the lift-off method.

The operation of the second embodiment will be described with reference to FIG. 9.

The electric field between the upper electrode 224 and lower electrode 212 is created by a variable voltage V applied to the electrode pad 224b. The applied voltage V also reverse-biases a pn junction in the optical waveguide 220, represented in the drawing as a pair of diodes, and determines the wavelength at which strong absorption begins in the absorbing layer 222. When this wavelength, referred to as the absorption edge, is longer than the wavelength of the light P entering the optical input end 220a, the light is greatly attenuated in the optical waveguide 220. When the absorption-edge wavelength is shorter than the wavelength of the entering light P, the light is only slightly attenuated in the optical waveguide 220.

When light is absorbed, photocurrent flows from the optical waveguide 220 to the upper electrode 224. Current I flowing into the first part 224a1 of the electrode stripe must pass through the thin-film resistor 224c1 to reach the electrode pad 224b. A voltage drop $V_1$ equal to IR occurs, where R is the resistance of the thin-film resistor 224c1. The voltage applied to the first part 224a1 of the upper electrode stripe is accordingly V—IR, instead of the voltage V applied to the second part 224a2. The electric field at the optical input end 220a of the optical waveguide 220 is therefore weaker than the electric field at the optical output end 220b, so absorption at the optical input end 220a is reduced.

The reduced absorption generates less heat at the optical input end 220a of the optical waveguide 220, enabling higher optical input power levels to be tolerated without damage. In the part of the optical waveguide 220 below the second part 224a2 of the electrode stripe, although the electric field is not reduced, some of the light P has already been absorbed near the optical input end 220a, so the amount of light absorption and consequent heating that take place below the second part 224a2 of the electrode stripe also remains below the damage level.

Compared with an electro-absorption modulator lacking the resistive member 224c, the electro-absorption modulator 202 can accordingly withstand higher optical power levels, enabling the laser-modulator 200 as a whole to generate more light for long-distance communication or other purposes.

Figure 10:
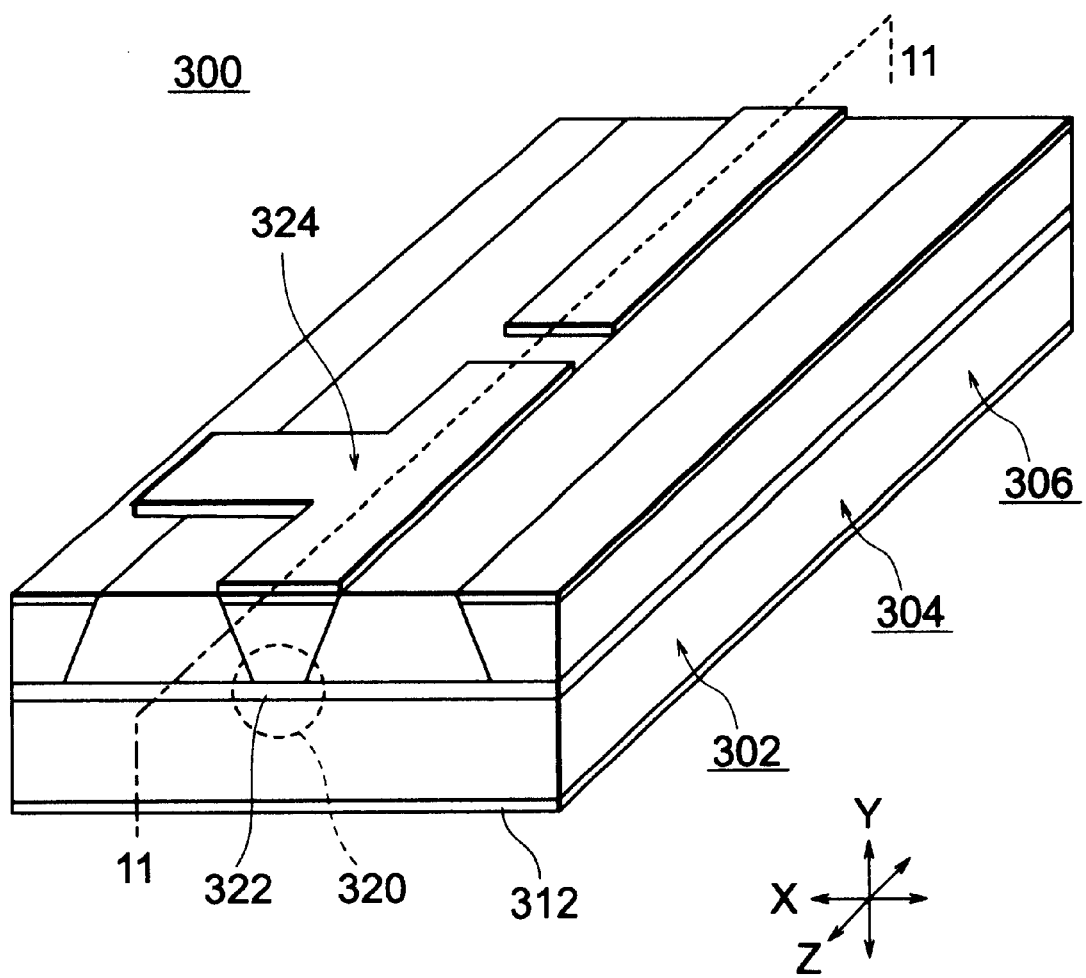
FIG. 10 is a perspective view of a monolithic laser-modulator device including an electro-absorption modulator illustrating a third embodiment of the invention.
Figure 11:
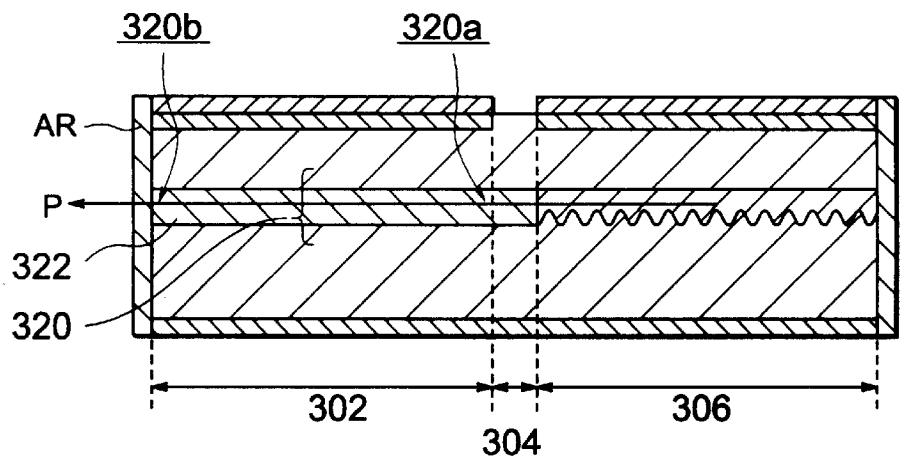
FIG. 11 is a sectional view through line 11—11 in FIG. 10.

Next, a third embodiment will be described, with reference to FIGS. 10 and 11.

These drawings show an integrated laser-modulator device 300 divided into an electro-absorption modulator zone 302, an isolation zone 304, and a DFB laser zone 306, with a All lower electrode 312 below all three zones. The isolation zone 304 and DFB laser zone 306 have the same internal structure and functions as the corresponding zones in the preceding embodiments. The electro-absorption modulator zone 302 includes an upper electrode 324 as in the first embodiment, an optical waveguide 320, and an absorbing layer 322. The absorbing layer 322, while generally similar to the absorbing layers in the preceding embodiments, differs as follows.

The difference is that the bandgap energy of the absorbing layer 322 is not constant, but increases from the optical output end 320b to the optical input end 320a. The bandgap energy gradient is not visible in the drawings. An increased bandgap energy hinders the absorption of light. The increasing bandgap energy thus counteracts the tendency for more light to be absorbed near the optical input end 320a of the optical waveguide 320. The bandgap energy profile of the absorbing layer 322 is preferably arranged so that light absorption is substantially uniform throughout the length of the optical waveguide 320. The total range of variation of the bandgap energy of the absorbing layer 322 should be calculated according to the length of the optical waveguide 320, the wavelength of the light produced in the DFB laser 306, and the total extinction ratio that must be produced by absorption in the absorbing layer 322. The bandgap energy may increase continuously, or in a series of steps.

The integrated laser-modulator 300 can be manufactured by the process shown in FIG. 4A, with a modification of the second crystal growth step S4. For example, the absorbing layer 322 can be grown by a selective growth method.

By reducing light absorption near the optical input end 320a of the optical waveguide 320, the third embodiment produces substantially the same effect as the second embodiment, enabling the electro-absorption modulator 302 to withstand higher levels of input optical power. Equalization of light absorption throughout the length of the optical waveguide 320 can maximize the allowable input power level by eliminating local overheating.

Next, a fourth embodiment will be described, with reference to FIGS. 12 and 13.

Figure 12:
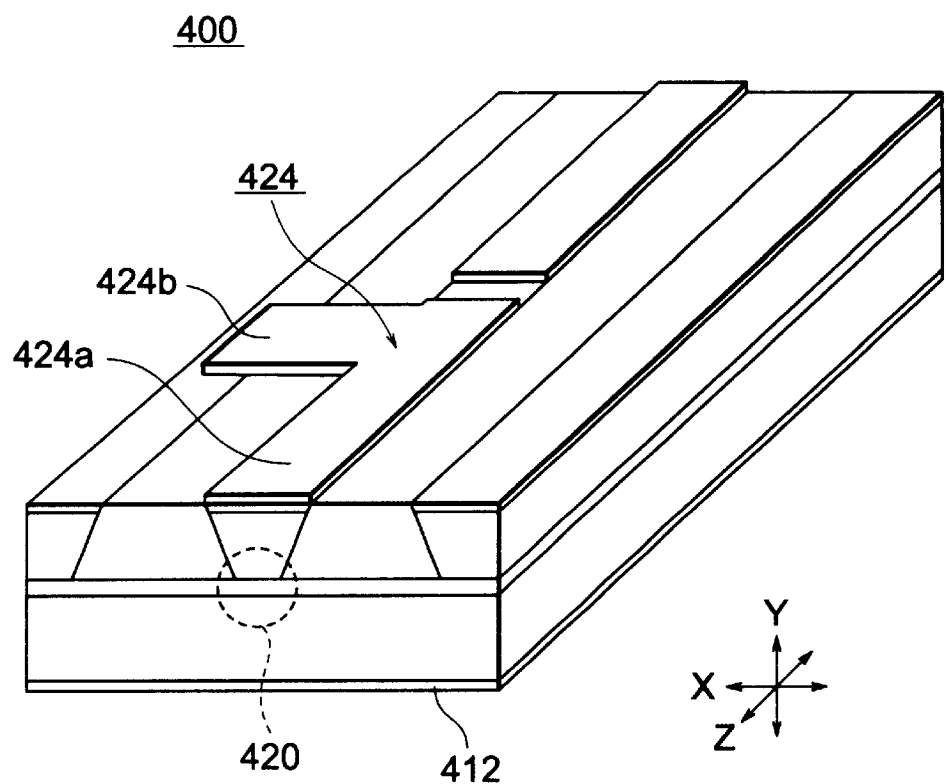
FIG. 12 is a perspective view of a monolithic laser-modulator device including an electro-absorption modulator illustrating a fourth embodiment of the invention.
Figure 13:
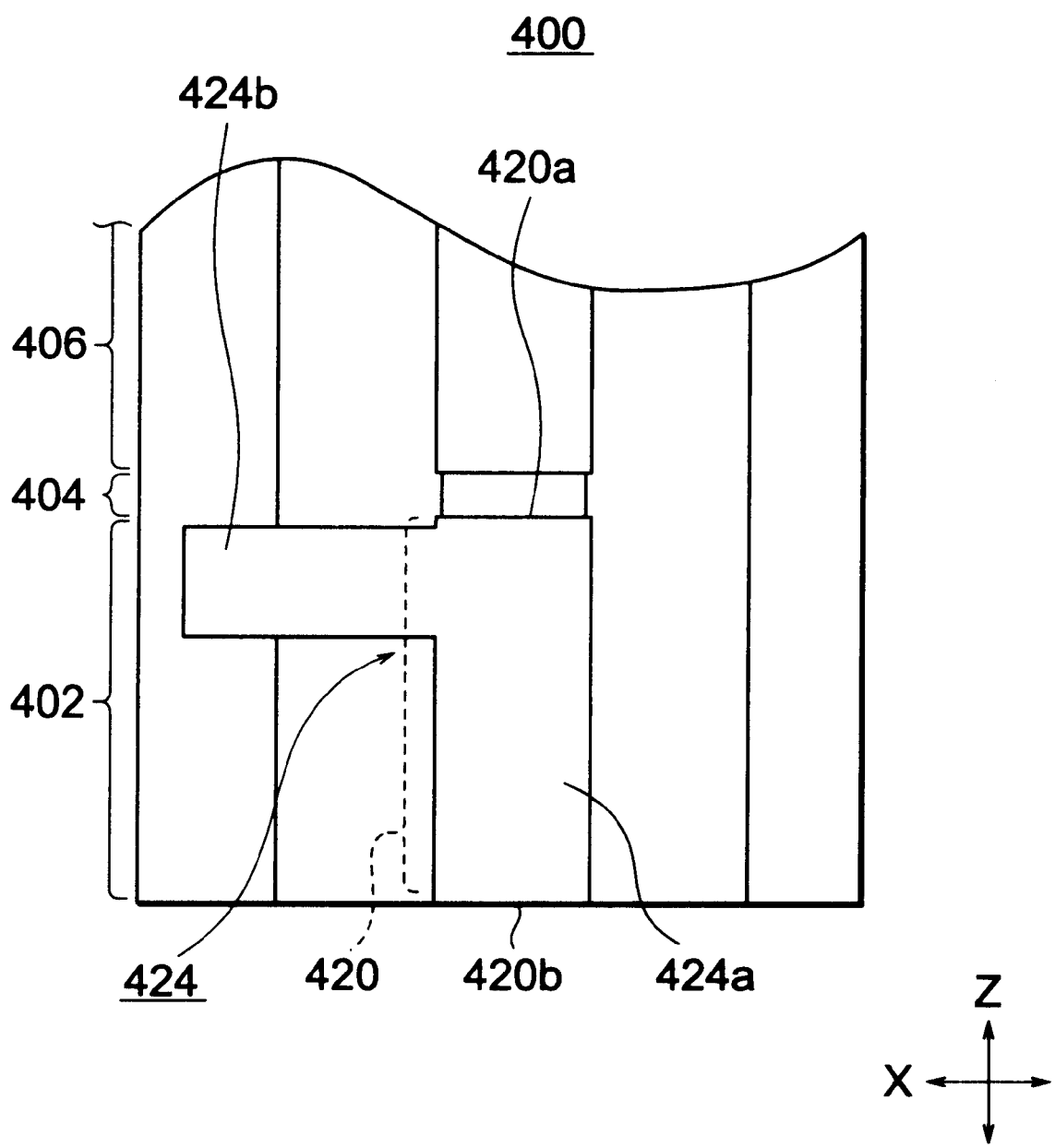
FIG. 13 is a plan view of the device in FIG. 12.

FIG. 12 shows an integrated laser-modulator device 400 having a lower electrode 412, an optical waveguide 420, and an upper electrode 424. The upper electrode 424 comprises an electrode stripe 424a and an electrode pad 424b. The device 400 is designed for use in optical communications. As shown in FIG. 13, the device comprises an electro-absorption modulator zone 402, an isolation zone 404, and a DFB laser zone 406. The isolation zone 404 and DFB laser zone 406 have the same internal structure and functions as in the preceding embodiments, but the electro-absorption modulator zone 402 differs from the preceding embodiments in the positioning of the electrode pad 424b, which is now disposed near the end of the electrode stripe 424a above the optical input end 420a of the optical waveguide 420.

In optical communications, a high-frequency voltage waveform applied to the electrode pad 424b must propagate throughout the electrode stripe 424a. This requirement suggests that the electrode pad 424b should be disposed in the conventional position near the center of the electrode stripe 424a, but in the inventor's view, the frequency levels used in optical communication systems at present are not so high as to prevent satisfactory voltage waveform propagation, even if the electrode pad 424b is disposed at one end of the electrode stripe 424a.

During operation of the integrated laser-modulator 400, the absorption of light in the optical waveguide 420 is accompanied by the above-described flow of current from the optical waveguide 420 to the electrode stripe 424a, through the electrode stripe 424a to the electrode pad 424b, and from the electrode pad 424b to the external power source. The current flow causes resistive heating in the electrode stripe 424a, but because most of the light absorption takes place near the optical input end 420a of the waveguide 420, and because the electrode pad 424b is disposed at this end of the upper electrode 424, most of the current reaches the electrode pad 424b without having to traverse the electrode stripe 424a for any appreciable distance, so the electrode stripe 424a is not heated as much as it would be if the electrode pad 424b were disposed near the middle of the electrode stripe 424a. This reduction of the heat generated in the electrode stripe 424a reduces the temperature of the optical waveguide 420.

The fourth embodiment accordingly raises the power level at which the DFB laser 406 can operate without damage to the electro-absorption modulator 402 caused by overheating.

The invention is not limited to the embodiments as described above. The first embodiment, for example, is not limited to the use of a thin metal film as a heat sink. The heat sink may be a thick metal film or layer, a metal plate, or any other thermally conductive body, including certain known types of ceramics having high thermal conductivity.

The second embodiment can be modified by dividing the upper electrode stripe into more than two parts, which are coupled in series by a plurality of resistive interconnecting members. Alternatively, the two or more parts of the electrode stripe may be coupled in parallel to the electrode pad through interconnecting members having different electrical resistances.

When the upper electrode stripe is divided into two or more parts that are coupled in series, the resistive interconnecting members may be disposed in line with the separate parts of the stripe, above the optical waveguide, possibly in a higher layer than the electrode stripe layer, instead of extending to one side.

The resistive member does not need to incorporate a material having a lower electrical conductivity than that of the electrode stripe. The entire resistive member and the electrode stripe may be formed from the same material, in the same metalization step, the desired voltage drop being produced by appropriate design of the length, width, and thickness dimensions of the resistive member. The manufacturing cost of the device can thereby be reduced, by reducing the number of separate fabrication steps, and manufacturing yields can be improved.

Various other structures can be used to produce a voltage drop at the end of the electrode stripe near the optical input end of the waveguide. For example, the electrical resistance of the electrode stripe itself may be varied, by varying the width, thickness, or composition of the stripe; a comparatively low-resistance interconnecting stripe and a higher-resistance electrode stripe may be interconnected in parallel at a plurality of points, excluding points near the input end; or the electrode stripe may comprise a comparatively high-resistance layer extending the full length of the stripe, and a low-resistance layer extending from the optical output end partway toward the optical input end.

The invention is not limited to the use of a bulk-crystal absorbing layer. The absorbing layer may have a multiple-quantum-well structure, a single-quantum-well structure, a superlattice structure, a strained-quantum-well structure, or any other type of structure.

Similarly, when the electro-absorption modulator is integrated with a DFB laser, the active layer of the laser is not limited to the multiple-quantum-well structure mentioned in the embodiments. The active layer of the DFB laser may have a bulk structure, a single-quantum-well structure, a superlattice structure, a strained-quantum-well structure or various other structures.

The invention is not limited to the use of a ridge waveguide with an inverted mesa structure. The optical waveguide may have an ordinary (non-inverted) mesa structure, a high mesa structure, a buried heterostructure, or any other structure. The invention can be practiced in electro-absorption modulators having a planar waveguide, as well as in electro-absorption modulators having a stripe-geometry waveguide. In electro-absorption modulators having a buried-heterostructure waveguide or high-mesa waveguide, the waveguide channel may be formed in the upper cladding layer and absorbing layer, or in the upper cladding layer, the absorbing layer, and a lower cladding layer, as is well known.

The invented electro-absorption modulator may be integrated with various optical and opto-electronic components other than DFB lasers, including both active and passive components. Examples of active semiconductor components include other types of semiconductor lasers, such as distributed Bragg reflection (DBR) lasers; light-emitting diodes (LEDs) and other light-emitting elements; photodiodes and other light-receiving elements; optical amplifiers; and other electro-absorption modulators. Examples of passive optical components with which the invented electro-absorption modulator may be integrated include optical branching couplers, polarizers, mode splitters, wavelength splitters, wavelength combiners, lenses, prisms, directional couplers, and various other optical waveguide devices.

The invented electro-absorption modulator need not be part of a monolithic integrated device. The invented electro-absorption modulator can be employed as a discrete device, or as part of a hybrid planar lightwave circuit (PLC) module, or in optical equipment in which different optical components are interconnected by optical fibers.

The embodiments have been described separately, but various combinations of the embodiments are possible.

Those skilled in the art will recognize that further variations are possible within the scope claimed below.

What is claimed is:

1. An electro-absorption modulator having an optical waveguide, a first electrode disposed above the optical waveguide, and a second electrode disposed below the optical waveguide, using an electric field generated between the first electrode and the second electrode to control absorption of light in the optical waveguide, so that the light is modulated by modulation of the electric field, comprising:

first and second heat sinks disposed beside respectively opposite sides of the optical waveguide and extending parallel to the optical waveguide, for conducting heat away from the optical waveguide.

2. The electro-absorption modulator of claim 1, wherein each of the first and second heat sinks comprises a thin metal film.

3. The electro-absorption modulator of claim 1, wherein the optical waveguide has an inverted-mesa structure.

4. The electro-absorption modulator of claim 1, wherein the optical waveguide has a ridge structure.

5. The electro-absorption modulator of claim 1, wherein the electro-absorption modulator is integrated with a semiconductor laser into a monolithic device.

6. An electro-absorption modulator having an optical waveguide with an optical input end and an optical output end, a first electrode disposed above the optical waveguide, and a second electrode disposed below the optical waveguide, using an electric field generated between the first electrode and the second electrode to control absorption of light in the optical waveguide, so that the light is modulated by modulation of the electric field, wherein the first electrode comprises:

an electrode stripe extending parallel to the optical waveguide, having a first end disposed comparatively near the optical input end of the optical waveguide and a second end disposed comparatively near the optical output end of the optical waveguide, for generating the electric field;

an electrode pad coupled to the electrode stripe and to an external power source; and at least one resistive member coupled to the electrode stripe, creating a voltage drop between the electrode pad and the first end of the electrode stripe.

7. The electro-absorption modulator of claim 6, wherein the electrode stripe is divided into at least a first part including said first end, end a second part including said second end.

8. The electro-absorption modulator of claim 7, wherein:

the resistive member interconnects the first part of the electrode stripe to the second part of the electrode stripe; and the electrode pad is coupled to the second part of the electrode stripe.

9. The electro-absorption modulator of claim 6, wherein the resistive member is disposed to one side of the electrode stripe.

10. The electro-absorption modulator of claim 6, wherein the resistive member comprises a material having a lower electrical conductivity than the electrode stripe.

11. The electro-absorption modulator of claim 6, wherein the resistive member comprises a thin-film resistor.

12. The electro-absorption modulator of claim 11, wherein the thin-film resistor comprises a material having a lower electrical conductivity than the electrode stripe.

13. The electro-absorption modulator of claim 6, wherein the optical waveguide has a ridge structure.

14. The electro-absorption modulator of claim 6, wherein the electro-absorption modulator is integrated with a semiconductor laser into a monolithic device.

15. An electro-absorption modulator having an optical waveguide with an optical input end, an optical output end, and an absorbing layer, also having a first electrode disposed above the optical waveguide, and a second electrode disposed below the optical waveguide, using an electric field generated between the first electrode and the second electrode to control absorption of light in the optical waveguide, so that the light is modulated by modulation of the electric field, wherein:

the absorbing layer of the optical waveguide has a higher bandgap energy at the optical input end than at the optical output end.

16. The electro-absorption modulator of claim 15, wherein the absorbing layer is formed by selective crystal growth.

17. The electro-absorption modulator of claim 15, wherein the optical waveguide has a ridge structure.

18. The electro-absorption modulator of claim 15, wherein the electro-absorption modulator is integrated with a semiconductor laser into a monolithic device.

19. An electro-absorption modulator having an optical waveguide with an optical input end and an optical output end, a first electrode disposed above the optical waveguide, and a second electrode disposed below the optical waveguide, using an electric field generated between the first electrode and the second electrode to control absorption of light in the optical waveguide, so that the light is modulated by modulation of the electric field, wherein the first electrode comprises:

an electrode stripe for generating an electric field and extending parallel to the optical waveguide, having a first end portion disposed comparatively near the optical input end of the optical waveguide, a second end portion disposed comparatively near the optical output end of the optical waveguide, and an intermediate portion disposed between the first and second end portions; and an electrode pad coupled to an external power source and extending from a side of the first end portion of the electrode stripe.

20. The electro-absorption modulator of claim 19, wherein the optical waveguide has a ridge structure.

21. The electro-absorption modulator of claim 19, wherein the electro-absorption modulator is integrated with a semiconductor laser into a monolithic device.

22. A method of fabricating a semiconductor optical device, comprising:

(a) forming an optical waveguide including a channel having an inverted mesa structure with an overhanging part; and (b) forming a heat sink disposed beside the optical waveguide, for conducting heat away from the optical waveguide, using the overhanging part of the inverted mesa structure as a spacer to produce a desired spacing between the heat sink and the optical waveguide.

23. The method of claim 22, wherein said step (b) comprises depositing a thin, thermally conductive film.

24. The method of claim 23, wherein said step (b) deposits said thin, thermally conductive film both beside said inverted mesa structure, to form the heat sink, and on top of said inverted mesa structure.

25. The method of claim 24, further comprising:

(c) diffusing an impurity element from the thin, thermally conductive film deposited on top of the inverted mesa structure into an upper part of the inverted mesa structure to form a contact layer in the inverted mesa structure; and (d) forming an electrode on the contact layer.

26. The method of claim 22, wherein the spacing between the heat sink and the optical waveguide is adjusted by adjusting a height of the inverted mesa structure.

* * * * *